(12) United States Patent
Chun

(10) Patent No.: US 11,302,633 B2
(45) Date of Patent: Apr. 12, 2022

(54) SEMICONDUCTOR DEVICE INCLUDING A FUSE LATCH FOR LATCHING DATA OF A REPAIR FUSE CELL

(71) Applicant: SK hynix Inc., Icheon-si (KR)

(72) Inventor: Duk Su Chun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 15 days.

(21) Appl. No.: 16/928,421

(22) Filed: Jul. 14, 2020

(65) Prior Publication Data

US 2021/0202381 A1 Jul. 1, 2021

(30) Foreign Application Priority Data

Dec. 31, 2019 (KR) .................. 10-2019-0178946

(51) Int. Cl.
*H01L 23/525* (2006.01)
*H01L 23/528* (2006.01)
*H01L 27/092* (2006.01)

(52) U.S. Cl.
CPC ...... *H01L 23/5256* (2013.01); *H01L 23/5286* (2013.01); *H01L 27/092* (2013.01)

(58) Field of Classification Search
CPC ............. H01L 23/5256; H01L 23/5286; H01L 27/092; H01L 27/11206; H01L 27/0207
See application file for complete search history.

(56) References Cited

U.S. PATENT DOCUMENTS 7,538,368 B2 * 5/2009 Yano .................. H01L 27/0207
257/202

FOREIGN PATENT DOCUMENTS

KR 1020160010166 A 1/2016
KR 1020180051134 A 5/2018

* cited by examiner

*Primary Examiner* — Quoc D Hoang
(74) *Attorney, Agent, or Firm* — William Park & Associates, Ltd.

(57) ABSTRACT

A fuse latch of a semiconductor device is disclosed. The fuse latch of the semiconductor device includes a plurality of PMOS transistors and a plurality of NMOS transistors. The fuse latch includes PMOS transistors and NMOS transistors configured to latch fuse cell data. In the fuse latch, the plurality of PMOS transistors and the plurality of NMOS transistors are arranged in a shape of two lines in each active region in a second direction.

20 Claims, 4 Drawing Sheets

SEMICONDUCTOR DEVICE INCLUDING A FUSE LATCH FOR LATCHING DATA OF A REPAIR FUSE CELL

CROSS-REFERENCE TO RELATED APPLICATION

This patent document claims the priority and benefits of Korean patent application No. 10-2019-0178946, filed on Dec. 31, 2019, which is hereby incorporated in its entirety by reference.

1. Technical Field

Embodiments of the present disclosure generally relate to semiconductor device, and more particularly to a semiconductor device including a fuse latch.

2. Related Art

With rapid development of higher-performance electronic systems (e.g., personal computers (PCs) or electronic communication systems), semiconductor devices acting as memories mounted to the electronic systems have been developed to implement products having higher speeds and higher degrees of integration.

In order to implement semiconductor devices having higher degrees of integration, a function for efficiently arranging memory cells of a memory cell region within a limited region is of importance. However, another function related to efficiently arranging a peripheral circuit region (hereinafter referred to as a peripheral region) that is needed to operate memory cells is more important than the function related to efficiently arranging memory cells of a memory cell region.

Many fuse-related circuits for repairing memory cells have been widely used in semiconductor devices. Therefore, technology of efficiently arranging such fuse-related circuits to attain a regional gain of semiconductor devices is also of importance.

SUMMARY

In accordance with an embodiment of the disclosed technology, a fuse latch of a semiconductor device may include first and second NMOS transistors, each of which is configured to receive a first control signal through a gate terminal of the first and second NMOS transistors, and transmits fuse cell data in response to the first control signal, a first inverter including a first PMOS transistor and a third NMOS transistor coupled in series between a power-supply voltage and a ground voltage, wherein an input node of the first inverter is coupled to the second NMOS transistor and an output node of the first inverter is coupled to the first NMOS transistor, a second inverter including a second PMOS transistor and a fourth NMOS transistor coupled in series between the power-supply voltage and the ground voltage, such that an input node of the second inverter is coupled to the output node of the first inverter and an output node of the second inverter is coupled to the input node of the first inverter, a fifth NMOS transistor, a gate terminal of which is coupled to the input node of the first inverter and the output node of the second inverter and a first terminal of which is coupled to a data output terminal, and a sixth NMOS transistor configured to receive a second control signal through a gate terminal of the sixth NMOS transistor, and configured to selectively couple the ground voltage to a second terminal of the fifth NMOS transistor in response to the second control signal. The first and second NMOS transistors may be formed in a first active region, the first and second PMOS transistors may be formed in a second active region located at one side of the first active region in a first direction, the third and fourth NMOS transistors may be formed in a third active region located at one side of the second active region in the first direction, and the fifth and sixth NMOS transistors may be formed in a fourth active region located at one side of the third active region in the first direction. The first and second PMOS transistors may be formed in a first active region, the first and second NMOS transistors may be formed in a second active region located at one side of the first active region in a first direction, the third and fourth NMOS transistors may be formed in a third active region located at one side of the second active region in the first direction, and the fifth and sixth NMOS transistors may be formed in a fourth active region located at one side of the third active region in the first direction.

In accordance with another embodiment of the disclosed technology, a fuse latch of a semiconductor device may including a plurality of PMOS transistors and a plurality of NMOS transistors configured to latch fuse cell data. The fuse latch comprises the plurality of PMOS transistors and the plurality of NMOS transistors overlapping an active regions may be arranged in a shape of two lines in each active region in a second direction.

In accordance with another embodiment of the disclosed technology, a fuse latch of a semiconductor device may include a data transmission circuit configured to transmit data to a first node and a second node, a latch circuit configured to latch the data received from the data transmission circuit through the first node and the second node, and a data output circuit configured to output the data latched by the latch circuit in response to a second control signal, wherein transistors contained in the data transmission circuit, the latch circuit, and the data output circuit are respectively formed in first to fourth active regions, and the first to fourth active regions are sequentially arranged in an N-P-N-N structure in a first direction.

In accordance with another embodiment of the disclosed technology, a fuse latch of a semiconductor device may include first and second NMOS transistors, each of which is configured to receive a first control signal through a gate terminal of the first and second NMOS transistors, and transmit fuse cell data in response to the first control signal, a first inverter including a first PMOS transistor and a third NMOS transistor coupled in series between a power-supply voltage and a ground voltage, wherein an input node of the first inverter is coupled to the second NMOS transistor and an output node of the first inverter is coupled to the first NMOS transistor, a second inverter including a second PMOS transistor and a fourth NMOS transistor coupled in series between the power-supply voltage and the ground voltage, such that an input node of the second inverter is coupled to the output node of the first inverter and an output node of the second inverter is coupled to the input node of the first inverter, a fifth NMOS transistor, a gate terminal of which is coupled to the input node of the first inverter and the output node of the second inverter and a first terminal of which is coupled to a data output terminal; and a sixth NMOS transistor configured to receive a second control signal through a gate terminal of the sixth NMOS transistor, and configured to selectively couple the ground voltage to a second terminal of the fifth NMOS transistor in response to the second control signal, wherein the first and second PMOS transistors are formed in a first active region, the first and second NMOS transistors are formed in a second active region located at one side of the first active region in a first direction, the third and fourth NMOS transistors are formed in a third active region located at one side of the second active region in the first direction, and the fifth and sixth NMOS transistors are formed in a fourth active region located at one side of the third active region in the first direction.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
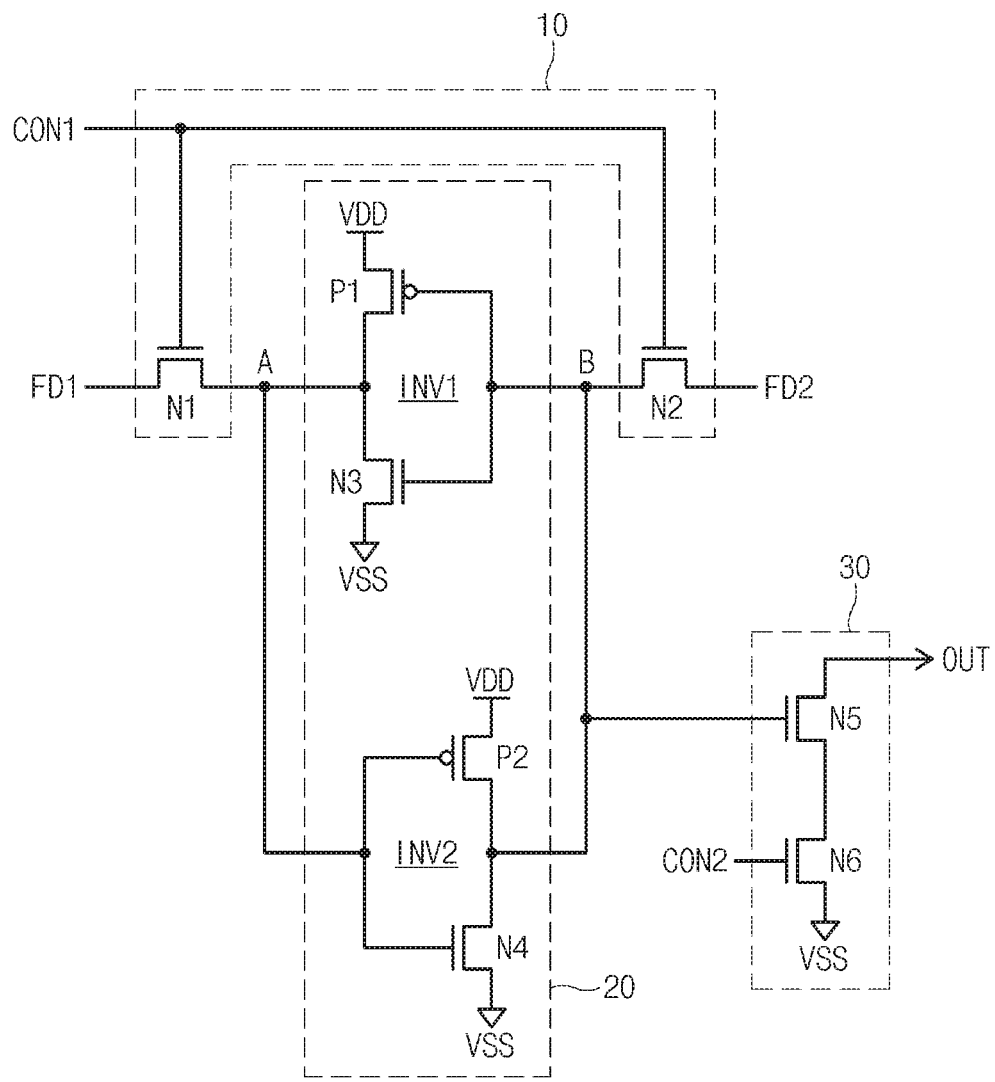
FIG. 1 is a circuit diagram illustrating an example of a circuit structure of a fuse latch of a semiconductor device based on some implementations of the disclosed technology.

This document may provide implementations and examples of a fuse latch of a semiconductor device that substantially addresses one or more issues due to limitations and disadvantages of the related art. Some implementations of the disclosed technology suggest a fuse latch having an improved structure so as to increase a regional gain of a semiconductor device. In recognition of the issues above, the disclosed technology may provide various implementations of a fuse latch of a semiconductor device which can increase a regional gain of the semiconductor device by improving a structure of the fuse latch.

Various embodiments of the disclosed technology may relate to a fuse latch having an improved structure so as to increase a regional gain of a semiconductor device.

Reference will now be made in detail to embodiments of the present disclosure, examples of which are illustrated in the accompanying drawings. Variations from the shapes of the illustrations as a result, for example, of manufacturing techniques and/or tolerances, are to be expected. Thus, the embodiments should not be construed as limited to the particular shapes of regions illustrated herein but may be to include deviations in shapes that result, for example, from manufacturing. In the drawings, lengths and sizes of layers and regions may be exaggerated for clarity. Wherever possible, the same reference numbers are used throughout the drawings to refer to the same or like portions.

In association with the embodiments of the present disclosure, specific structural and functional descriptions are disclosed only for illustrative purposes. The embodiments represent a limited number of possible embodiments. Embodiments of the present disclosure can be implemented in various ways without departing from the scope or spirit of the present disclosure.

In describing the present disclosure, the terms "first" and "second" may be used to describe multiple components from one another, but the components are not limited by the terms in number or order. The terms may be used to distinguish one component from another component. For example, a first component may be called a second component and a second component may be called a first component without departing from the scope of the present disclosure.

The terms used in the present application are merely used to describe specific embodiments and are not intended to limit the present disclosure. A singular expression may include a plural expression unless explicitly stated otherwise.

Unless otherwise defined, all terms used herein, including technical or scientific terms, have the same meanings as understood by those skilled in the art. Terms defined in a generally used dictionary may be analyzed to have the same meaning as the context of the relevant art and should not be analyzed to have an ideal meaning or an excessively formal meaning unless clearly defined in the present application. The terminology used in the present disclosure is for the purpose of describing particular embodiments only and is not intended to limit the disclosure.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

FIG. 1 is a circuit diagram illustrating an example of a circuit structure of a fuse latch of a semiconductor device based on some implementations of the disclosed technology.

The semiconductor device may detect a defective memory cell (i.e., a defective cell) from among a total of memory cell arrays through testing. In this case, one or more addresses for accessing the defective cell will hereinafter be referred to as repair information. The repair information may be stored in a fuse array (not shown) in units of a fuse set (i.e., on a fuse-set basis). The fuse latch may read out repair information pre-stored in the fuse array during a boot-up process of the semiconductor device, such that the fuse latch may store the read repair information therein.

Referring to FIG. 1, the fuse latch 1 may include a data transmission circuit 10, a latch circuit 20, and a data output circuit 30.

The data transmission circuit 10 may transmit fuse cell data FD1 and FD2 (i.e., data) to the latch circuit 20 in response to a control signal (CON1). In this case, the fuse cell data FD1 may be opposite in value to the fuse cell data FD2. For example, if the fuse cell data FD1 has a high-level phase (H), the fuse cell data FD2 may transition to a low-level phase (L). In an embodiment, if the fuse cell data FD1 has a low-level (L), the fuse cell data FD2 may be a high-level (H). The data transmission circuit 10 may include pass-purposed NMOS transistors N1 and N2.

The NMOS transistor N1 may include a gate terminal, a first terminal, and a second terminal. In this case, the gate terminal may receive the control signal (CON1), the first terminal may receive fuse cell data FD1 by connecting to a first output terminal of a fuse cell (not shown), and the second terminal may be coupled to the latch circuit 20 through a node (A). The NMOS transistor N2 may include a gate terminal, a first terminal, and a second terminal. In this case, the gate terminal may receive the control signal (CON1), the first terminal may receive fuse cell data FD2 by connecting to a second output terminal of a fuse cell (not shown), and the second terminal may be coupled to the latch circuit 20 through a node (B).

If the control signal (CON1) is at a high level, the NMOS transistors N1 and N2 may be turned on. As a result, the fuse cell data FD1 may be transmitted to the node (A), and the fuse cell data FD2 may be transmitted to the node (B).

The latch circuit 20 may latch fuse cell data FD1 and FD2 received through the data transmission circuit 10. The latch circuit 20 may include inverters INV1 and INV2, input/output (I/O) terminals of which are coupled to be fed back to each other.

The inverter INV1 may include a PMOS transistor P1 and an NMOS transistor N3 that are coupled in series between a ground voltage (VSS) terminal and a power-supply voltage (VDD) terminal, A gate terminal of the PMOS transistor P1 and a gate terminal of the NMOS transistor N3 may be commonly coupled to a second terminal of the NMOS transistor N2 through the node (B). A first terminal of the PMOS transistor P1 may be coupled to the power-supply voltage (VDD) terminal, and the second terminal of the PMOS transistor P1 may be coupled to a second terminal of the NMOS transistor N3. A first terminal of the NMOS transistor N3 may be coupled to the ground voltage (VSS) terminal, and a second terminal of the NMOS transistor N3 may be coupled to a second terminal of the PMOS transistor P1.

That is, one node to which the second terminal of the PMOS transistor P1 and the second terminal of the NMOS transistor N3 are commonly coupled may serve as an input node (i.e., Node A) of the inverter INV1, such that the input node (Node A) may be coupled to the second terminal of the NMOS transistor N1. The commonly-coupled gate terminals of the PMOS transistor P1 and the NMOS transistor N3 may serve as the output node (Node B), such that the commonly-coupled gate terminals of the PMOS transistor P1 and the NMOS transistor N3 are coupled to the second terminal of the NMOS transistor N2.

The inverter INV2 may include a PMOS transistor P2 and an NMOS transistor N4 that are coupled in series between the ground voltage (VSS) terminal and the power-supply voltage (VDD) terminal. Gate terminals of the PMOS transistor P2 and the NMOS transistor N4 may be commonly coupled to the second terminal of the NMOS transistor N1 through the node (A). The first terminal of the PMOS transistor P2 may be coupled to the power-supply voltage (VDD) terminal, and the second terminal of the PMOS transistor P2 may be coupled to the second terminal of the NMOS transistor N4. The first terminal of the NMOS transistor N4 may be coupled to the ground voltage (VSS) terminal, and the second terminal of the NMOS transistor N4 may be coupled to the second terminal of the PMOS transistor P2.

That is, one node to which the second terminal of the PMOS transistor P2 and the second terminal of the NMOS transistor N4 are commonly coupled may serve as an input node (Node B) of the inverter INV2, such that the input node (Node B) may be coupled to the second terminal of the NMOS transistor N2. The commonly-coupled gate terminals of the PMOS transistor P2 and the NMOS transistor N4 may serve as the output node (Node A), such that the commonly-coupled gate terminals of the PMOS transistor P2 and the NMOS transistor N4 are coupled to the second terminal of the NMOS transistor N1.

If the node A is at a high level, the NMOS transistor N4 of the inverter INV2 may be turned on. As a result, the node B may transition to a logic low level, such that the PMOS transistor P1 may be turned on. If the PMOS transistor P1 is turned on, the node A may remain at a high level, such that the latch circuit 20 may latch high-level data.

In contrast, if the node A is at a low level, the PMOS transistor P2 of the inverter INV2 may be turned on. As a result, the node B may transition to a logic high level, such that the NMOS transistor N3 may be turned on. If the NMOS transistor N3 is turned on, the node A may remain at a low level, such that the latch circuit 20 may latch low-level data.

The data output circuit 30 may output data latched by the latch circuit 20 in response to a control signal (CON2). The data output circuit may include NMOS transistors N5 and N6 coupled in series between the data output terminal (OUT) and the ground voltage (VSS) terminal.

The NMOS transistor N5 may include a gate terminal coupled to the node B, a first terminal coupled to the data output terminal (OUT), and a second terminal coupled to the NMOS transistor N6. The NMOS transistor N6 may include a gate terminal receiving the control signal (CON2), a first terminal coupled to the ground voltage (VSS) terminal, and a second terminal coupled to the second terminal of the NMOS transistor N5.

If the control signal (CON2) is at a high level, the NMOS transistor N6 may be turned on. If the node B transitions to a high level, the NMOS transistor N5 is turned on, such that the latched low-level data is transmitted to the output terminal (OUT).

Figure 2:
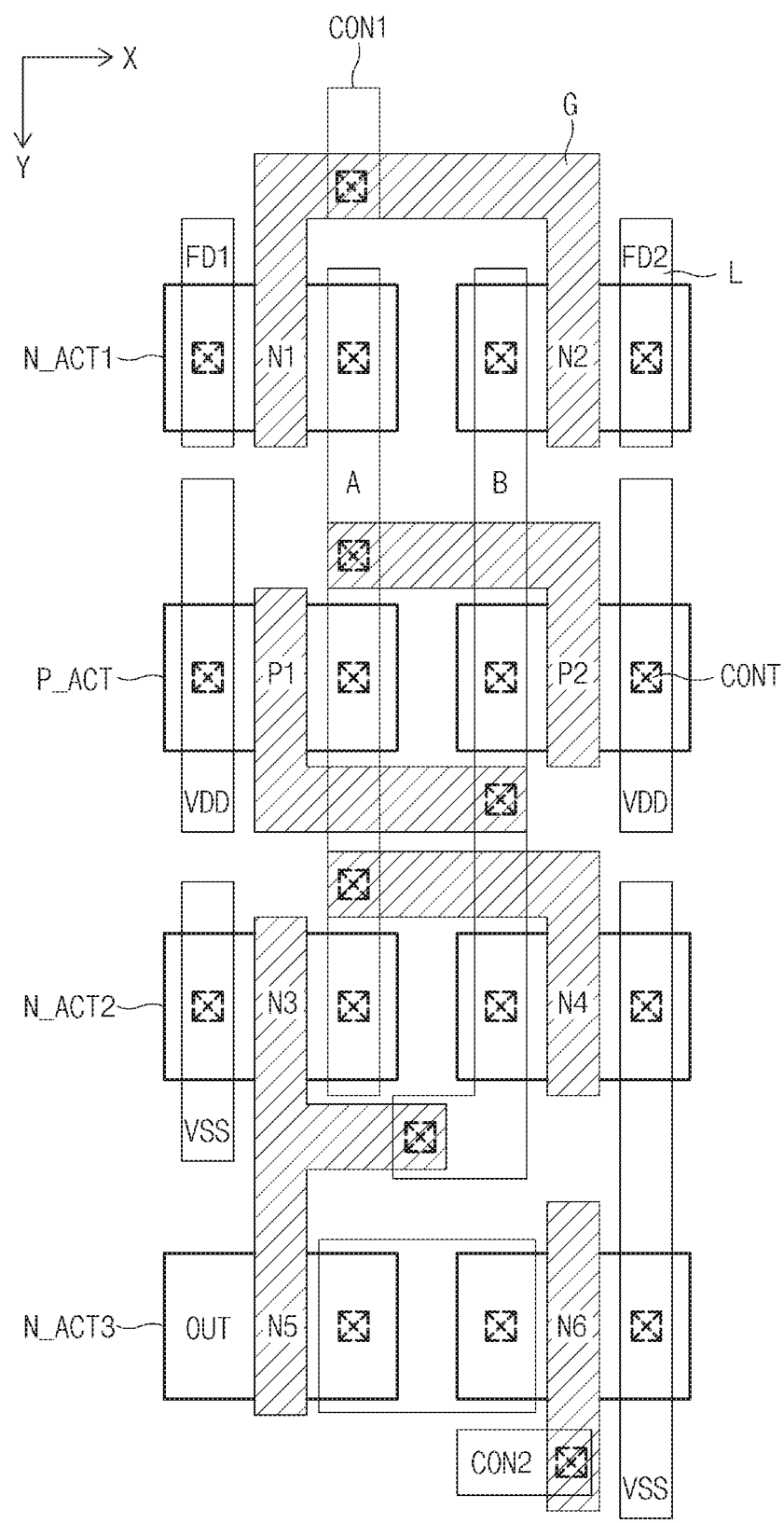
FIG. 2 is a layout diagram illustrating an example of actual arrangement of constituent elements contained in the fuse latch shown in FIG. 1 based on some implementations of the disclosed technology.

FIG. 2 is a layout diagram illustrating an example of actual arrangement of constituent elements contained in the fuse latch 1 shown in FIG. 1 based on some implementations of the disclosed technology.

For convenience of description, reference numerals indicating the PMOS transistors P1 and P2 and the NMOS transistors N1~N6 shown in FIG. 1 are written at gate terminals of the corresponding transistors shown in FIG. 2.

Referring to FIG. 2, each of the NMOS transistors N1 and N2 of the data transmission circuit 10 may be formed in an N-type active region (N_ACT1). The N-type active region (N_ACT1) may be isolated for each of the NMOS transistors N1 and N2. In an embodiment, a portion of the NMOS transistor N1 overlapping a first portion of the N-type active region (N_ACT1) is isolated from a portion of the NMOS transistor N2 overlapping a second portion of the N-type active region (N_ACT1). In an embodiment, the N-type active region (N_ACT1) is isolated from the P-type active region (P_ACT), N-type active region (N_ACT2), and N-type active region (N_ACT3) so that the NMOS transistors N1, N2 are isolated from the PMOS transistors P1 and P2, NMOS transistors N3, N4, N5, and N6.

Each of the PMOS transistors P1 and P2 of the latch circuit 20 may be formed in a P-type active region (P_ACT). The P-type active region (P_ACT) may be isolated for each of the PMOS transistors P1 and P2. In an embodiment, a portion of the PMOS transistor P1 overlapping a first portion of the P-type active region (P_ACT) is isolated from a portion of the PMOS transistor P2 overlapping a second portion of the P-type active region (P_ACT). That is, the PMOS transistor P1 contained in the inverter INV1 and the PMOS transistor P2 contained in the inverter INV2 may be formed in each P-type active region. In a second direction (e.g., X-axis direction) perpendicular to a first direction (e.g., Y-axis direction), a total length formed by arrangement of the P-type active region (P_ACT) may be identical to the length of the N-type active region (N_ACT1). In an embodiment, in a second direction (e.g., X-axis direction) perpendicular to a first direction (e.g., Y-axis direction), a total length formed by arrangement of the P-type active region (P_ACT) may be substantially identical to the length of the N-type active region (N_ACT1).

The NMOS transistors N3 and N4 of the latch circuit 20 may be formed in another N-type active region (N_ACT2). The N-type active region (N_ACT2) may be isolated for each of the NMOS transistors N3 and N4. In an embodiment, a portion of the NMOS transistor N3 overlapping a first portion of the N-type active region (N_ACT2) is isolated from a portion of the NMOS transistor N4 overlapping a second portion of the N-type active region (N_ACT2). The NMOS transistors N3 and N4 respectively contained in different inverters INV1 and INV2 may be formed in each N-type active region (N_ACT2).

The NMOS transistors N5 and N6 contained in the data output circuit 30 may be formed in another N-type active region (N_ACT3). The gate terminal of the NMOS transistor N5 may be commonly coupled to the gate terminal of the NMOS transistor N3. The N-type active region (N_ACT3) may be isolated for each of the NMOS transistors N5 and N6, In an embodiment, a portion of the NMOS transistor N5 overlapping a first portion of the N-type active region (N_ACT3) is isolated from a portion of the NMOS transistor N6 overlapping a second portion of the N-type active region (N_ACT3). In the second direction (i.e., X-axis direction) perpendicular to the first direction (i.e., Y-axis direction), a total length formed by arrangement of the N-type active region (N_ACT3) may be identical to the length of each of the N-type active regions N_ACT1 and N_ACT2. In an embodiment, in the second direction (i.e., X-axis direction) perpendicular to the first direction (i.e., Y-axis direction), a total length formed by arrangement of the N-type active region (N_ACT3) may be substantially identical to the length of each of the N-type active regions N_ACT1 and N_ACT2.

In this case, the N-type active region (N_ACT1) may be located at one side of the P-type active region (P_ACT) in the first direction (i.e., Y-axis direction). The N-type active region (N_ACT2) may be located at the other side (i.e., the side opposite to the N-type active region N_ACT1) of the P-type active region (P_ACT) in the first direction (i.e., Y-axis direction). The N-type active region (N_ACT3) may be located at one side of the N-type active region (N_ACT2) in the first direction (i.e., Y-axis direction).

In other words, in each fuse latch (i.e., a unit fuse latch) 1, the NMOS transistors N1~N6 may be formed in three N-type active regions N_ACT1, N_ACT2, and N_ACT3. The PMOS transistors P1 and P2 may be formed in a single P-type active region (P_ACT).

The N-type active region (N_ACT1) formed in one stage may be located at one side of the P-type active region (P_ACT). The N-type active regions N_ACT2 and N_ACT3 formed in two stages may be located at the other side of the P-type active region (P_ACT). Therefore, the active regions N_ACT1, P_ACT, N_ACT2, and N_ACT3 may be sequentially arranged in an N-P-N-N structure as a whole.

For example, the N-type active region (N_ACT1) formed in one stage may be located at one side (in the Y-axis direction) of the P-type active region (P_ACT). The N-type active regions N_ACT2 and N_ACT3 formed in two stages may be located at the other side (in the Y-axis direction) of the P-type active region (P_ACT).

The embodiments of the disclosed technology have been disclosed, for example, that the active regions N_ACT1, P_ACT, N_ACT2, and N_ACT3 are arranged in the N-P-N-N structure in the first direction (Y-axis direction) as a whole. However, the scope or spirit of the disclosed technology is not limited thereto, and the active regions P_ACT, N_ACT1, N_ACT2, and N_ACT3 may also be arranged in a P-N-N-N or N-N-N-P structure in the first direction (Y-axis direction) as a whole.

In the N-type active region (N_ACT1), first terminals of the NMOS transistors N1 and N2 configured to respectively receive fuse cell data FD1 and FD2 may be located at both ends of the N-type active region (N_ACT1). Through the above-mentioned structure, in a situation in which the fuse latches 1 are disposed in an array shape, the fuse latches adjacent to each other may share input terminals (related to signal transmission lines) respectively receiving the fuse cell data FD1 and FD2. In an embodiment, lines providing the fuse cell data FD1 and FD2 may be located at both ends of the N-type active region (N_ACT1) as shown in FIG. 2.

In addition, power lines for providing the power-supply voltage (VDD) and the ground voltage (VSS) may be disposed at both sides of each fuse latch 1. Through the above-mentioned structure, in a situation in which the fuse latches 1 are disposed in the array shape, the adjacent fuse latches may share the corresponding power lines. In an embodiment, a line provides the ground voltage VSS to an end of the N-type active region (N_ACT3) as shown in FIG. 2. In an embodiment, power lines are disposed at both ends of the N-type active region (N_ACT2) to supply a ground voltage as shown in FIG. 2. In an embodiment, power lines are disposed at both ends of the P-type active region (P_ACT) to supply a power voltage as shown in FIG. 2.

In FIG. 2, transmission lines of the fuse data FD1 and FD2 and the control signals CON1 and CON2 and other transmission lines needed for transmission of the power-supply voltages VDD and VSS may be formed of metal lines denoted by MO layers. The lines (L) may be coupled to the gate terminal (G) or the active regions P_ACT, N_ACT2, and N_ACT3 through a contact (CONT).

In accordance with an embodiment of the disclosed technology, two NMOS transistors N1 and N2 may be disposed over the N-type active region N_ACT1 in the second direction (i.e., X-axis direction). In accordance with an embodiment of the disclosed technology, two PMOS transistors P1 and P2 may be disposed over the P-type active region (P_ACT) in the second direction (i.e., X-axis direction). In the P-type active region (P_ACT), first terminals of the PMOS transistors P1 and P2 may be located at both ends of the P-type active region (P_ACT). In accordance with an embodiment of the disclosed technology, two NMOS transistors N3 and N4 may be disposed over the N-type active region N_ACT2 in the second direction (i.e., X-axis direction). In the N-type active region (N_ACT2), first terminals of the NMOS transistors N3 and N4 may be located at both ends of the N-type active region (N_ACT2). In accordance with an embodiment of the disclosed technology, two NMOS transistors N5 and N6 may be disposed over the N-type active region (N_ACT3) in the second direction (i.e., X-axis direction). In the N-type active region (N_ACT3), first terminals of the NMOS transistors N5 and N6 may be located at both ends of the N-type active region (N_ACT3).

Therefore, a portion of the NMOS transistors overlapping the active regions are arranged in a shape of two lines may be disposed in one active region in the second direction (i.e., X-axis direction), and a portion of the PMOS transistors overlapping the active regions are arranged in a shape of two lines may be disposed in the other active region in the second direction (i.e., X-axis direction), such that the second direction (i.e., X-axis direction) can be greatly reduced in width.

Figure 3:
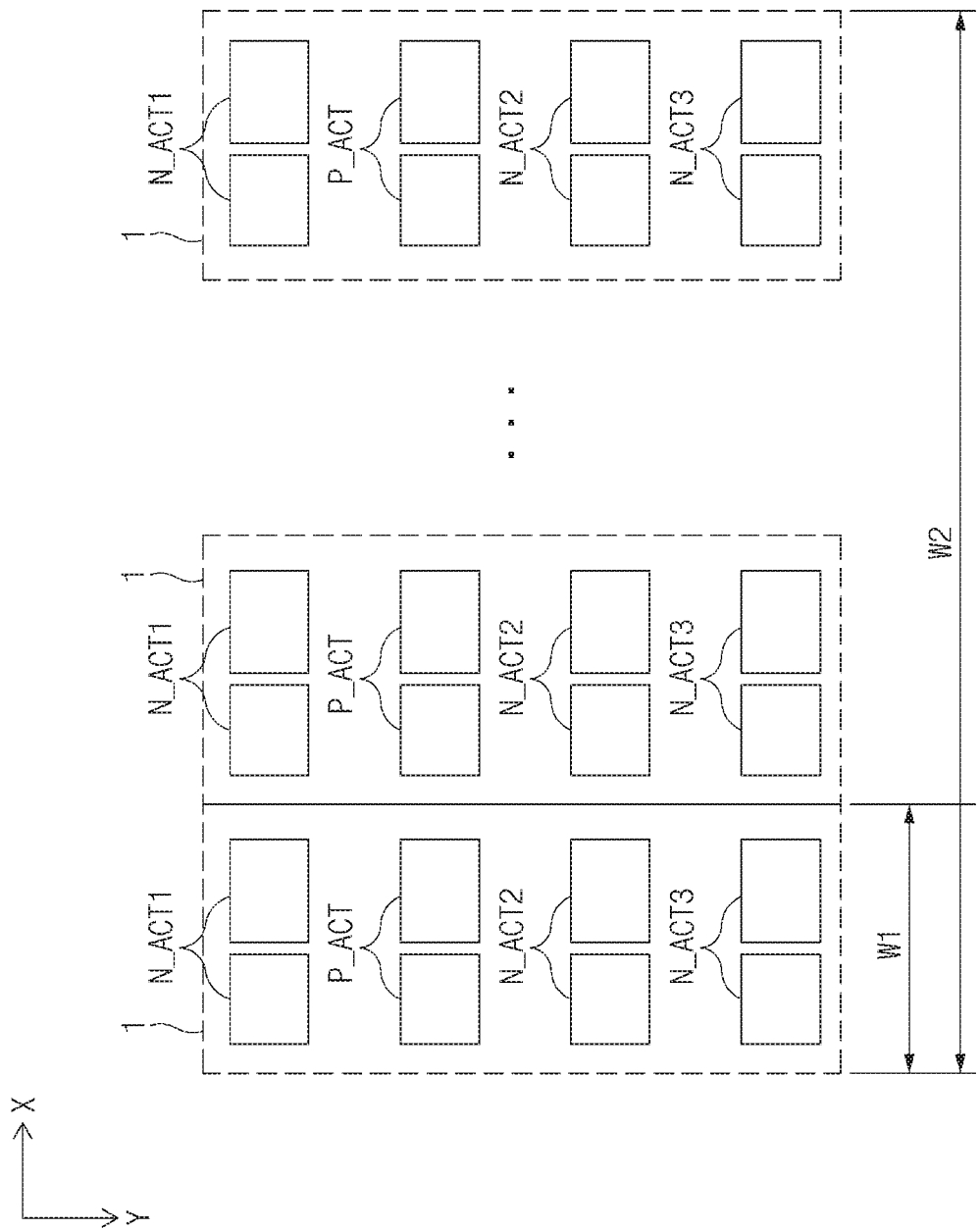
FIG. 3 is a schematic diagram illustrating an example of an arrangement structure of active regions of unit fuse latches when the unit fuse latches are arranged in an array shape based on some implementations of the disclosed technology.

FIG. 3 is a schematic diagram illustrating an example of an arrangement structure of active regions of unit fuse latches when the unit fuse latches are arranged in an array shape based on some implementations of the disclosed technology.

Referring to FIG. 3, each unit fuse latch 1 may include the N-type active region (N_ACT1), the P-type active region (P_ACT), the N-type active region (N_ACT2), and the N-type active region (N_ACT3) that are sequentially arranged in the order of N→P→N→N in the first direction (i.e., Y-axis direction).

The fuse latch array may include a plurality of unit fuse latches 1 arranged in one line in the second direction (i.e., X-axis direction).

As described above, since the active regions of each unit fuse latch 1 are arranged in the N-P-N-N structure, the width (W1) of the unit fuse latch 1 can be reduced or shortened. For example, if the unit fuse latches 1 formed in the array shape are arranged in one line, the width (W2) of the fuse latch array can be greatly reduced or shortened.

Figure 4:
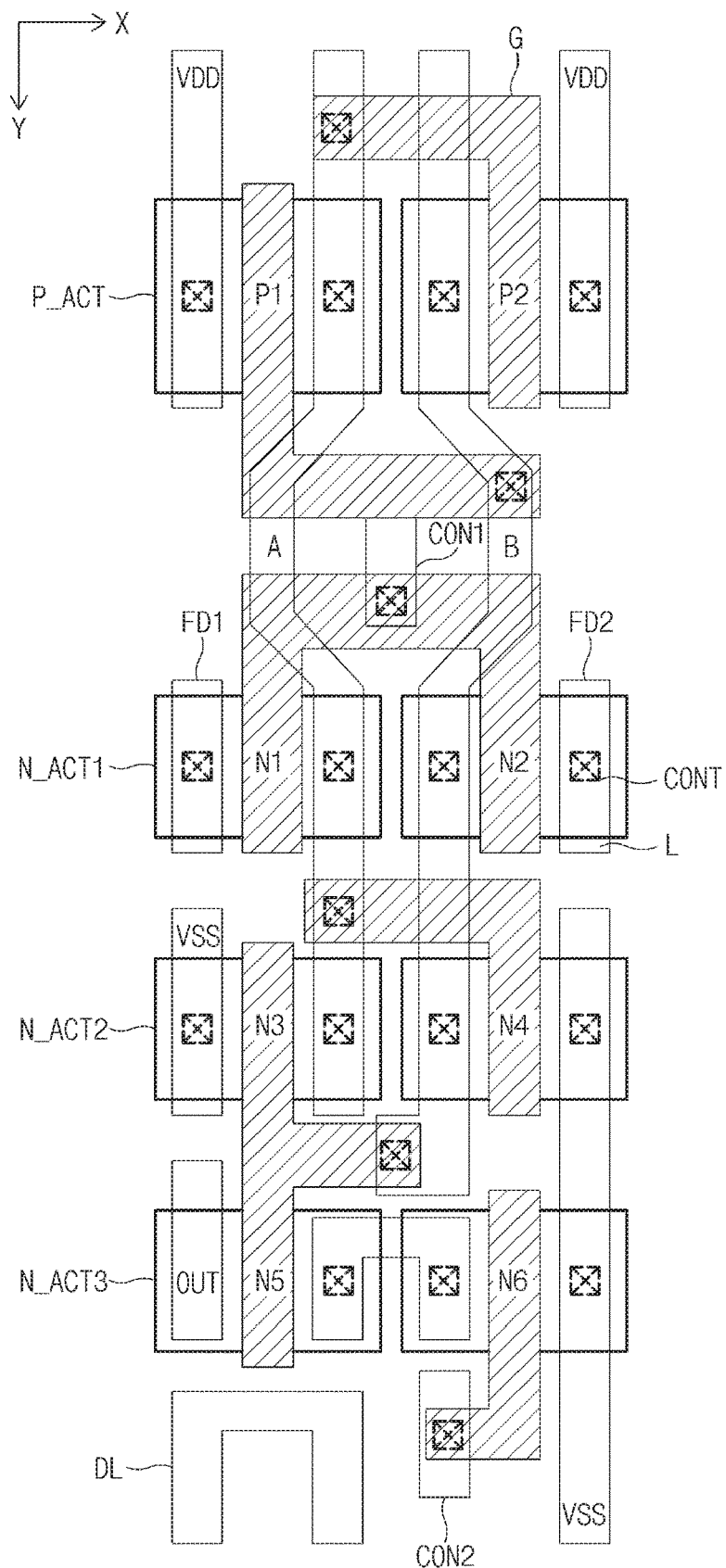
FIG. 4 is a schematic diagram illustrating an example of actual arrangement of constituent elements contained in the fuse latch shown in FIG. 1 based on some implementations of the disclosed technology.

FIG. 4 is a schematic diagram illustrating an example of actual arrangement of constituent elements contained in the fuse latch 1 shown in FIG. 1 based on some implementations of the disclosed technology.

For convenience of description, reference numerals indicating the PMOS transistors P1 and P2 and the NMOS transistors N1~N6 shown in FIG. 1 are written at gate terminals of the corresponding transistors shown in FIG. 4.

In FIG. 4, the same constituent elements and the same layout structure as in FIG. 2 will herein be omitted for convenience of description, and the schematic diagram of FIG. 4 will hereinafter be described centering upon some characteristics different from those of FIG. 2 for convenience of description and better understanding of the disclosed technology.

As can be seen from FIG. 4, the PMOS transistors P1 and P2 contained in the latch circuit 20 may be formed in each P-type active region (P_ACT). The NMOS transistors N1 and N2 contained in the data transmission circuit 10 may be formed in each N-type active region (N_ACT1).

In addition, the NMOS transistors N3 and N4 contained in the latch circuit 20 may be formed in each N-type active region (N_ACT2). The NMOS transistors N5 and N6 contained in the data output circuit 30 may be formed in each N-type active region (N_ACT3).

In this case, the P-type active region (P_ACT) may be disposed at one side of the N-type active region (N_ACT1) in the first direction (i.e., Y-axis direction). The N-type active region (N_ACT2) may be disposed at the other side (i.e., the side opposite to the P-type active region P_ACT) of the N-type active region (N_ACT1) in the first direction (i.e., Y-axis direction). The N-type active region (N_ACT3) may be disposed at one side of the N-type active region (N_ACT2) in the first direction (i.e., Y-axis direction). One or more dummy lines (DL) may be additionally disposed adjacent the N-type active region (N_ACT3) (i.e., the side opposite to the N-type active region (N_ACT1) in the first direction (i.e., Y-axis direction).

In other words, in each fuse latch (i.e., unit fuse latch) 1, the NMOS transistors N1~N6 may be formed in three N-type active regions N_ACT1, N_ACT2, and N_ACT3. The PMOS transistors P1 and P2 may be formed in a single P-type active region (P_ACT).

The P-type active region (P_ACT) formed in one stage may be located at one side of the N-type active region (N_ACT1). The N-type active regions N_ACT1, N_ACT2, and N_ACT3 formed in three stages may be located at the other side of the P-type active region (P_ACT). Therefore, the active regions P_ACT, N_ACT1, N_ACT2, and N_ACT3 may be sequentially arranged in a P-N-N-N structure as a whole.

In FIG. 4, two PMOS transistors P1 and P2 may be disposed over the P-type active region (P_ACT) in the second direction (i.e., X-axis direction). Two NMOS transistors N1 and N2 may be disposed over the N-type active region (N_ACT1) in the second direction (i.e., X-axis direction). Two NMOS transistors N3 and N4 may be disposed over the N-type active region (N_ACT2) in the second direction (i.e., X-axis direction). In addition, two NMOS transistors N5 and N6 may be disposed over the N-type active region (N_ACT3) in the second direction (i.e., X-axis direction).

In addition, since the P-type active region (P_ACT) shown in FIG. 4 is disposed at the highest region (i.e., the uppermost region) in the first direction (i.e., Y-axis direction) of the fuse latch 1, a guard ring for picking up the NMOS well need not be used. As a result, the width of the second direction (i.e., X-axis direction) shown in FIG. 4 can be greatly reduced or shortened.

The embodiments shown in FIG. 4 have been disclosed, for example, that the active regions P_ACT, N_ACT1, N_ACT2, and N_ACT3 are sequentially arranged in the P-N-N-N structure in the first direction (i.e., Y-axis direction) as a whole. However, the scope or spirit of the disclosed technology is not limited thereto, and the active regions P_ACT, N_ACT1, N_ACT2, and N_ACT3 can also be arranged in the N-N-N-P structure in the first direction (i.e., Y-axis direction) as a whole. In an embodiment, the N-N-N-P structure may have the same structure as the P-N-N-N structure shown in FIG. 4.

As is apparent from the above descriptions, the fuse latch of the semiconductor device according to the embodiments of the disclosed technology can increase a regional gain of the semiconductor device by improving a structure of the fuse latch.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A fuse latch of a semiconductor device comprising:
first and second NMOS transistors, each of which is configured to receive a first control signal through a gate terminal of the first and second NMOS transistors, and transmit fuse cell data in response to the first control signal;
a first inverter including a first PMOS transistor and a third NMOS transistor coupled in series between a power-supply voltage and a ground voltage, wherein an input node of the first inverter is coupled to the second NMOS transistor and an output node of the first inverter is coupled to the first NMOS transistor;
a second inverter including a second PMOS transistor and a fourth NMOS transistor coupled in series between the power-supply voltage and the ground voltage, such that an input node of the second inverter is coupled to the output node of the first inverter and an output node of the second inverter is coupled to the input node of the first inverter;
a fifth NMOS transistor, a gate terminal of which is coupled to the input node of the first inverter and the output node of the second inverter and a first terminal of which is coupled to a data output terminal; and
a sixth NMOS transistor configured to receive a second control signal through a gate terminal of the sixth NMOS transistor, and configured to selectively couple the ground voltage to a second terminal of the fifth NMOS transistor in response to the second control signal,
wherein the first and second NMOS transistors are formed in a first active region, the first and second PMOS transistors are formed in a second active region located at one side of the first active region in a first direction, the third and fourth NMOS transistors are formed in a third active region located at one side of the second active region in the first direction, and the fifth and sixth NMOS transistors are formed in a fourth active region located at one side of the third active region in the first direction.

2. The fuse latch of the semiconductor device according to claim 1, wherein the first terminals of the first and second NMOS transistors are respectively disposed at both ends of the first active region.

3. The fuse latch of the semiconductor device according to claim 1, wherein the first terminals of the first and second PMOS transistors are respectively disposed at both ends of the second active region.

4. The fuse latch of the semiconductor device according to claim 1, wherein the first terminals of the third and fourth NMOS transistors are respectively disposed at both ends of the third active region.

5. The fuse latch of the semiconductor device according to claim 1, wherein the first terminals of the fifth and sixth NMOS transistors are respectively disposed at both ends of the fourth active region.

6. The fuse latch of the semiconductor device according to claim 1, wherein a portion of the first NMOS transistor overlapping a first portion of the first active region is isolated from a portion of the second NMOS transistor overlapping a second portion of the first active region.

7. The fuse latch of the semiconductor device according to claim 1, wherein a portion of the first PMOS transistor overlapping a first portion of the second active region is isolated from a portion of the second PMOS transistor overlapping a second portion of the second active region.

8. The fuse latch of the semiconductor device according to claim 1, wherein a portion of the third NMOS transistor overlapping a first portion of the third active region is isolated from a portion of the fourth NMOS transistor overlapping a second portion of the third active region.

9. The fuse latch of the semiconductor device according to claim 1, wherein a portion of the fifth NMOS transistor overlapping a first portion of the fourth active region is isolated from a portion of the sixth NMOS transistor overlapping a second portion of the fourth active region.

10. The fuse latch of the semiconductor device according to claim 1, further comprising:
first and second lines disposed at both ends of the first active region, and configured to transmit and receive the fuse cell data;
a first power line disposed at both ends of the second active region, and configured to provide the power-supply voltage; and
a second power line coupled to one end of the fourth active region through a contact, and configured to provide the ground voltage.

11. The fuse latch of the semiconductor device according to claim 10, wherein the third active region is coupled to the second power line through both ends of the third active region.

12. The fuse latch of the semiconductor device according to claim 1, wherein a portion of the transistors overlapping the first to fourth active regions are arranged in a shape of two lines in each of the active regions in a second direction perpendicular to the first direction.

13. A fuse latch of a semiconductor device including a plurality of PMOS transistors and a plurality of NMOS transistors configured to latch fuse cell data,
wherein the fuse latch comprises the plurality of PMOS transistors and the plurality of NMOS transistors, a portion of the plurality of PMOS and NMOS transistors overlapping active regions are arranged in a shape of two lines in each of active regions in a second direction,
wherein the plurality of PMOS transistors are arranged in two lines in the second direction of form pairs of PMOS transistors of a same type,
wherein the plurality of NMOS transistors are arranged in two lines in the second direction of form pairs of PMOS transistors of a same type.

14. The fuse latch of the semiconductor device according to claim 13, wherein the plurality of PMOS transistors are formed in a single P-type active region.

15. The fuse latch of the semiconductor device according to claim 14, wherein each of the active regions includes:
a first N-type active region disposed at one side of the P-type active region in a first direction perpendicular to the second direction;
a second N-type active region disposed at another side of the P-type active region in the first direction; and
a third N-type active region disposed at one side of the second N-type active region in the first direction.

16. The fuse latch of the semiconductor device according to claim 15, wherein:
the first N-type active region formed in one stage is disposed at one side of the P-type active region; and
the second and third N-type active regions formed in two stages are disposed at another side of the P-type active region.

17. The fuse latch of the semiconductor device according to claim 14, wherein each of the active regions includes:

a first N-type active region disposed at another side of the P-type active region in a first direction perpendicular to the second direction;
a second N-type active region disposed at another side of the first N-type active region in the first direction; and
a third N-type active region disposed at another side of the second N-type active region in the first direction.

18. A fuse latch of a semiconductor device comprising:
a data transmission circuit configured to transmit data to a first node and a second node;
a latch circuit configured to latch the data received from the data transmission circuit through the first node and the second node; and
a data output circuit configured to output the data latched by the latch circuit in response to a second control signal,
wherein transistors contained in the data transmission circuit, the latch circuit, and the data output circuit are respectively formed in first to fourth active regions, and the first to fourth active regions are sequentially arranged in an N-P-N-N structure in a first direction.

19. The fuse latch of the semiconductor device according to claim 18, wherein a portion of the transistors overlapping the first to fourth active regions are arranged in a shape of two lines in a second direction perpendicular to the first direction.

20. A fuse latch of a semiconductor device comprising:
first and second NMOS transistors, each of which is configured to receive a first control signal through a gate terminal of the first and second NMOS transistors, and transmit fuse cell data in response to the first control signal;
a first inverter including a first PMOS transistor and a third NMOS transistor coupled in series between a power-supply voltage and a ground voltage, wherein an input node of the first inverter is coupled to the second NMOS transistor and an output node of the first inverter is coupled to the first NMOS transistor;
a second inverter including a second PMOS transistor and a fourth NMOS transistor coupled in series between the power-supply voltage and the ground voltage, such that an input node of the second inverter is coupled to the output node of the first inverter and an output node of the second inverter is coupled to the input node of the first inverter;
a fifth NMOS transistor, a gate terminal of which is coupled to the input node of the first inverter and the output node of the second inverter and a first terminal of which is coupled to a data output terminal; and
a sixth NMOS transistor configured to receive a second control signal through a gate terminal of the sixth NMOS transistor, and configured to selectively couple the ground voltage to a second terminal of the fifth NMOS transistor in response to the second control signal,
wherein the first and second PMOS transistors are formed in a first active region, the first and second NMOS transistors are formed in a second active region located at one side of the first active region in a first direction, the third and fourth NMOS transistors are formed in a third active region located at one side of the second active region in the first direction, and the fifth and sixth NMOS transistors are formed in a fourth active region located at one side of the third active region in the first direction.

* * * * *